(12) United States Patent
Flohrs et al.

(10) Patent No.: US 8,072,043 B2
(45) Date of Patent: Dec. 6, 2011

(54) SEMICONDUCTOR COMPONENT

(75) Inventors: Peter Flohrs, Reutlingen (DE); Alfred Goerlach, Kusterdingen (DE); Peter Urbach, Gomaringen (DE); Wolfgang Feiler, Reutlingen (DE); Ning Qu, Reutlingen (DE); Klaus Heyers, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 462 days.

(21) Appl. No.: 11/664,857

(22) PCT Filed: Sep. 12, 2005

(86) PCT No.: PCT/EP2005/054523
§ 371 (c)(1),
(2), (4) Date: May 5, 2009

(87) PCT Pub. No.: WO2006/037711
PCT Pub. Date: Apr. 13, 2006

(65) Prior Publication Data
US 2009/0206438 A1    Aug. 20, 2009

(30) Foreign Application Priority Data
Oct. 6, 2004 (DE) .................... 10 2004 048 607

(51) Int. Cl.
*H01L 29/00* (2006.01)

(52) U.S. Cl. . 257/550; 257/607; 257/613; 257/E21.042; 257/E21.056; 257/E21.077; 257/E21.085; 257/E21.135; 257/E21.275

(58) Field of Classification Search .................. 257/550, 257/607, 613, 398, 399, 519, 544, 549, E21.042, 257/E21.056, E21.077, E21.085, E21.135, 257/E21.275
See application file for complete search history.

(56) References Cited

U.S. PATENT DOCUMENTS

| | | | |
|---|---|---|---|
| 3,171,068 A | 2/1965 | Denkewalter et al. | |
| 3,729,662 A | 4/1973 | Langdon | |
| 4,035,757 A | 7/1977 | Einthoven et al. | |
| 4,065,742 A | 12/1977 | Kendall et al. | |
| 4,670,731 A | 6/1987 | Zeile et al. | |
| 6,686,625 B2 * | 2/2004 | Tihanyi ........................ | 257/331 |
| 6,800,925 B2 * | 10/2004 | Rossmeier et al. ........... | 257/547 |
| 6,906,533 B1 * | 10/2004 | Henninger et al. ........... | 257/328 |
| 7,361,970 B2 * | 4/2008 | Barthelmess et al. ........ | 257/607 |
| 2001/0022385 A1 | 9/2001 | Sakakibara et al. | |
| 2004/0070050 A1 | 4/2004 | Chi | |

FOREIGN PATENT DOCUMENTS

| | | |
|---|---|---|
| DE | 41 22 252 | 1/1992 |
| DE | 10 2004 048 607 | 4/2006 |
| JP | 52-139583 | 11/1977 |
| JP | 59-115566 | 7/1984 |
| JP | 4-262579 | 9/1992 |
| JP | 6-342878 | 12/1994 |
| JP | 10-229698 | 8/1998 |

(Continued)

*Primary Examiner* — David Nhu

(74) *Attorney, Agent, or Firm* — Kenyon & Kenyon LLP

(57) ABSTRACT

A semiconductor component and a method for manufacturing such a semiconductor component which has a resistance behavior which depends heavily on the temperature. This resistance behavior is obtained by a special multi-layer structure of the semiconductor component, one layer being designed in such a way that, for example, multiple p-doped regions are present in an n-doped region, said regions being short-circuited on one side via a metal-plated layer. For example, the semiconductor component may be used for reducing current peaks, by being integrated into a conductor. In the cold state, the semiconductor component has a high resistance which becomes significantly lower when the semiconductor component is heated as a result of the flowing current.

28 Claims, 1 Drawing Sheet

FOREIGN PATENT DOCUMENTS

| | | |
|---|---|---|
| JP | 10-335584 | 12/1998 |
| JP | 11-287713 | 10/1999 |
| JP | 2004-502305 | 1/2004 |
| RU | 2 086 043 | 7/1997 |
| WO | WO 02/01643 | 1/2002 |
| WO | WO 2004 093102 | 10/2004 |

* cited by examiner

SEMICONDUCTOR COMPONENT

RELATED APPLICATION INFORMATION

This patent application is a national phase application of International Patent Application No. PCT/EP2005/054523 filed on Sep. 12, 2005, which claims priority from German patent application DE 102004048607.7 filed on Oct. 6, 2004.

FIELD OF THE INVENTION

The present invention relates to a semiconductor component, in particular a temperature-dependent semiconductor switch having a temperature-dependent resistance, which may be used for current limiting.

BACKGROUND INFORMATION

It is necessary in many electrotechnical applications to limit the electric current which flows in an electric circuit to a maximum value. In particular so-called inrush peaks, which primarily occur when inductive consumers are switched on, must be typically limited to maximum values. This is particularly true in motor vehicle electrical systems in which, for example, the starter represents a very low-resistance load having high inductivity which, when switched on at the beginning of the starting process, results in a current peak and thus in a voltage dip in the electrical system. If the current peak can be limited, the voltage dip in the electrical system also turns out to be smaller. After the current peak has ended, i.e., when activating a starter in a vehicle after approximately one hundred milliseconds, the current limiting should no longer be effective if possible, so that the then-flowing current is not needlessly reduced.

For example, limiting of high current peaks may be implemented by using electronic power components. There are also suggestions in which an NTC resistor, i.e., a resistor having a negative temperature coefficient, is used for current limiting in the supply lead to the consumer, e.g., in the supply lead for the starter. Such an NTC resistor limits the current peak which occurs during the starting operation since the resistance of the cold component is relatively high. When the NTC resistor is heated by the electrical power, which is converted in the resistor when current flows, the value of the NTC resistance decreases and reduces the current through the consumer only slightly. DE 41 22 252 A1 describes such current limiting for a starter in a vehicle in which the negative temperature coefficient of the resistor is utilized for damping the current peak in the cold state and to conduct the current well in the heated state.

International Patent Application DE 2004/00 07 76 (not a prior publication) proposes to install in the starter line a resistor which is designed as a silicon resistor having slightly doped silicon. This resistor changes its resistance at higher temperatures by reaching the intrinsic conduction, thus resulting in a clear reduction of the resistance value. The use of such a resistor in the starter lead ensures that the starter current is limited when the resistor is cold, thereby damping the current peak which occurs when the starter is switched on, while the resistance value is reduced after heating of the resistor as a result of the current flowing through it and the flowing current is only slightly reduced.

Temperature-dependent resistors made of silicon having negative temperature coefficients (NTC resistors) have the disadvantage that, with the used dopings in the range of $10^{14}$ per cm$^2$, resistance values distinctly lower than at room temperature can be noticed only at temperatures around 300° C. Reaching such temperatures periodically makes very high demands on the construction and connecting technology. With distinctly lower doping of the silicon, the area needed for representing a certain resistance value is very large and/or the layer thickness is very small.

SUMMARY OF THE INVENTION

The semiconductor component according to the present invention has the advantage over the related art that the temperature at which the resistance value decreases may be changed as desired and may thus also be reduced, which also means that the resistance value at a certain temperature may be variably set. This advantage is achieved in that by integrating p-doped islands into the n-conducting silicon, the temperature at which the resistance changes is influenced, in particular it decreases. In a particularly advantageous manner, the value or the magnitude of the resistance may arbitrarily be changed via the doping profile and the geometry. A predefinable intended resistance and even a certain temperature-dependent resistance characteristic is thus settable.

Further advantages of the exemplary embodiment and/or exemplary method of the present invention are achieved by the measures specified herein. The component according to the exemplary embodiment and/or exemplary method of the present invention is designed in a particularly advantageous manner in such a way that it assumes the character of a switch, the resistance of the semiconductor component very rapidly changing over time when, for example, the temperature-dependent startup condition is reached. At otherwise established conditions, this time until startup depends on the assembly conditions, in particular on the thermal capacities and thermal resistances. Such a temperature and/or time behavior for the value of a resistance is achieved in known components in a similar manner by a so-called DIAC (diode for alternating current). However, such a DIAC has a symmetrical characteristics curve and switches when a certain voltage is exceeded while blocking below this voltage and thus does not indicate the intrinsic behavior of a resistor having a finite resistance value.

The methods according to the present invention for manufacturing semiconductor components having the features described herein enable reliable and trouble-free manufacturing of the semiconductor components using measures and technologies known in semiconductor manufacturing.

DETAILED DESCRIPTION

Figure 1:
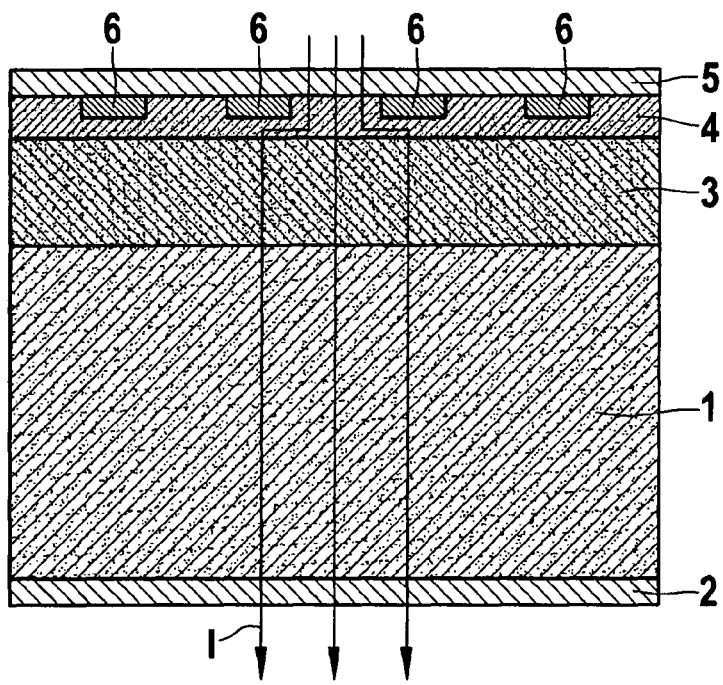
FIG. 1 shows a schematic cross section through a semiconductor component according to the present invention.

FIG. 1 shows an exemplary embodiment of a semiconductor component according to the present invention in a schematic cross section. The semiconductor element is made up of a heavily doped substrate 1 having a metallic terminal 2 at its one lower main surface according to the representation in FIG. 1. A less heavily doped zone 3 of the same conductivity type, which is applied over the entire upper main surface, is applied over heavily doped substrate 1. A further zone 4 of the same conductivity type but with heavier doping, which is also applied over the entire surface, joins zone 3. A second metallic terminal 5, also applied over the entire surface, delimits the semiconductor component.

Regions 6 of an opposite conductivity type are applied to sub-sections of heavier doped zone 4. The pn junction, which occurs between zones 4 and 6 on the upper (according to the representation in FIG. 1) main surface of the semiconductor body, is short-circuited by metal plating 5.

Heavily doped substrate 1 is made of antinomy-doped or may be arsenic-doped silicon, for example. Zone 3 is made of epitaxially deposited phosphorus-doped silicon, for example. Zone 4 has a stepped impurity profile, for example, which is generated by two ion implantations having different ion types and energy. Advantageous is a flat arsenic implantation having low energy and a deeper phosphorus implantation having higher energy.

For example, zone 6 is limited to spot-shaped and strip-shaped regions via photo lithography and defined via boron implantation. A tempering step is carried out after the implantations, the penetration depth of the boron ions in zone 6, after this tempering step, being between the penetration depth of the arsenic and phosphorus ions in zone 4. In the exemplary embodiment, both metallic terminals 2 and 5 are applied over the entire surface of the upper side and the lower side of the wafer and are solderable so that the semiconductor component may be introduced into an electric circuit; this is carried out by one current conductor being soldered to the upper layer and another current conductor being soldered to the lower layer. After applying a voltage, a current I then flows whose distribution or segmentation into individual components in the semiconductor component is indicated by the three arrows.

In principle, metallic terminals 2 and 5 may also be designed in such a way that they cover only predefinable sub-areas. An additional possibility is, starting at a wafer, e.g., a silicon wafer, to manufacture the semiconductor component or the semiconductor chip as a substrate and, after sawing the wafer, to mount the obtained semiconductor component or the semiconductor chip in a housing which contains an adequate thermal mass, e.g., in the form of copper, above and below the chip.

The semiconductor element is manufactured using the following steps:

Heavily doped substrate 1, which is a commercially available arsenic substrate (n-conducting silicon having arsenic doping), is treated using an epitaxial method, layer 3 being applied. The epitaxy essentially determines the value of resistance of the semiconductor component. By taking into account the outward diffusion of the substrate and of layer 4 for a chip size of 16 mm$^2$, a layer of 10 ohm-centimeter having a thickness of 5µ results in a resistance of approximately 10 milliohm at a temperature of 25° C. and low current.

After epitaxy of layer 3, zone 4 is produced. For producing zone 4, an implantation of arsenic and phosphorus over the entire surface is carried out. In the next step, photoresist is applied and a photo mask is produced. The next step includes exposure with the photo mask applied for producing p-islands 6 in zone 4 and the photoresist is developed.

Boron is implanted in a further step, thereby creating the p areas. After a tempering step using a predefinable thermal treatment, metal plating is applied on the front and back sides of the chip via sputtering, thereby creating metal layers 2 and 5.

The operation of the semiconductor component may be explained as follows:

After introducing the semiconductor component into a current conductor and applying a voltage to the current conductor, a current I flows through the semiconductor component whose direction of flow is indicated by the arrows. The current flows between the p-doped areas in layer 4 at least partially parallel to the surface of the semiconductor component. The component of the current parallel to the surface causes a voltage drop which—depending on current, temperature, doping profile and geometry of the p islands—results in an increase in the pn junction between layers 4 and 6 below zone 6 and thus in a reduction of the resistance value of zone 3 due to hole injection.

The time until the temperature necessary for the switching operation is reached is in turn a function of the thermal time constant of the mounted component. The time is the greater the more suitable metal is used, e.g., copper, this metal being used on both sides if possible, and the smaller is the thermal resistance of the soldered joint between the chip and the copper.

Figure 2:
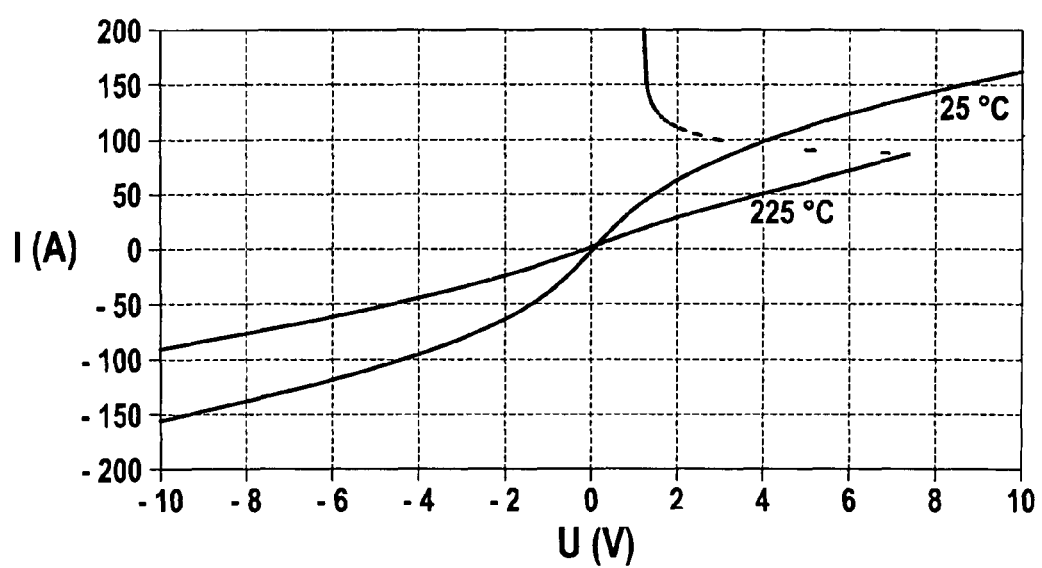
FIG. 2 shows a characteristics curve which indicates the relationship between current and voltage at different temperatures of the component.

FIG. 2 shows a characteristics curve for the semiconductor component in which the current is plotted in amperes against the voltage in volts, the course for two different temperatures being shown, namely 25° C. and 225° C. As is apparent in FIG. 2, the characteristics curve is symmetric with respect to the zero point at 25° C., i.e., symmetric to U=0 and I=0. The S shape may be explained by the decrease in the charge carrier mobility at high field strengths and also by the fact that the temperature does not remain constant during characteristics curve measurement. At 225° C., the characteristics curve has an almost linear course over a wide range and changes its characteristic suddenly above a certain voltage. Depending on temperature and current, the component thus switches into a low-resistance state and the characteristic of a diode characteristics curve.

The semiconductor component according to the present invention is particularly suited to be used as a switch having a certain temperature characteristic. When a certain condition is met, e.g., when a certain temperature is reached, such a great change in the characteristics of the component may occur that this corresponds to a switching operation.

If the semiconductor component is integrated into a starter lead it makes it possible to prevent the occurrence of current peaks during startup since it is highly resistive at low temperatures. At higher temperatures, caused by the energy conversion in the still cold semiconductor component, the value of the resistance of the semiconductor component is reduced and it no longer impedes the current at the then-prevailing higher temperatures.

If the semiconductor component is used as a thermal switch, a system may be established which blocks the current at low temperatures and conducts the current at high temperatures, the switching point or the switching range being settable in wide limits. The value or the magnitude of the resistance may be modified in any way via the doping profile and the geometry. A predefinable intended resistance and even a certain temperature-dependent resistance curve is thus settable. It is also of the essence that the resistance of the semiconductor component changes very rapidly when the temperature-dependent startup condition is reached.

What is claimed is:

1. A semiconductor component comprising:
   a heavily doped n conducting substrate including one of antimony-doped and arsenic-doped silicon, the heavily doped n conducting substrate having a metal plating on its one main surface, its other main surface being in contact with a less heavily doped zone of the same conductivity type; and a further layer of the same conductivity type having a higher doping and a metal plating which forms the other main surface of the semiconductor component;

wherein regions of an opposite conductivity type are introduced into sub-areas of the less heavily doped zone, a pn junction resulting between zones on a second main surface of a semiconductor body being short-circuited by the metal plating.

2. The semiconductor component of claim 1, wherein one of the zones is made of epitaxially deposited phosphorus-doped silicon and is n conducting.

3. The semiconductor component of claim 1, wherein another of the zones has a stepped impurity profile.

4. The semiconductor component of claim 3, wherein the another of the zones has different As ions and P ions which are located in different areas of the less heavily doped zone.

5. The semiconductor component of claim 1, wherein at least one metallic terminal is applied over an entire surface of main boundary surfaces of a semiconductor substrate.

6. The semiconductor component of claim 5, wherein the at least one metallic terminal is solderable.

7. The semiconductor component of claim 1, wherein one of a semiconductor chip and the substrate having different areas is situated in a housing, a thermally and electrically effective copper mass being present on both sides of the chip.

8. The semiconductor component of claim 7, wherein a resistance of the electrically effective copper mass is temperature-dependent and exhibits substantial changes in a settable temperature range.

9. The semiconductor component of claim 8, wherein the temperature-dependent resistance is settable at least one of via a selection of a doping profile and via a selection of a geometry of the semiconductor component.

10. The semiconductor component of claim 9, wherein the temperature range, in which the temperature-dependent resistance exhibits substantial changes, is settable at least one of via a selection of the doping profile and via a selection of the geometry of the semiconductor component.

11. The semiconductor component of claim 10, wherein it is used as a temperature-dependent switch.

12. The semiconductor component of claim 10, wherein the switching temperature is settable via selection of the doping profile and/or via selection of the geometry of the semiconductor component, the switching temperature being the temperature at which a substantial change in the temperature-dependent resistance occurs.

13. The semiconductor component of claim 10, wherein the time until a switching temperature is reached is established by setting a predefinable thermal time constant of the semiconductor component.

14. The semiconductor component of claim 10, wherein it is used as temperature-dependent current limiting device.

15. A semiconductor component comprising:
a heavily doped substrate having a metal plating on its one main surface, its other main surface being in contact with a less heavily doped zone of the same conductivity type; and a further layer of the same conductivity type having a higher doping and a metal plating which forms the other main surface of the semiconductor component;

wherein regions of an opposite conductivity type are introduced into sub-areas of a less heavily doped zone, a pn junction resulting between zones on a second main surface of a semiconductor body being short-circuited by the metal plating, and wherein one of the zones is n conducting and made of epitaxially deposited phosphorus-doped silicon.

16. The semiconductor component of claim 15, wherein the heavily doped substrate includes one of antimony-doped and arsenic-doped silicon and is n conducting.

17. The semiconductor component of claim 15, wherein another of the zones has a stepped impurity profile.

18. The semiconductor component of claim 17, wherein the another of the zones has different As ions and P ions which are located in different areas of the less heavily doped zone.

19. The semiconductor component of claim 15, wherein at least one metallic terminal is applied over an entire surface of main boundary surfaces of a semiconductor substrate.

20. The semiconductor component of claim 19, wherein the at least one metallic terminal is solderable.

21. The semiconductor component of claim 15, wherein one of a semiconductor chip and the substrate having different areas is situated in a housing, a thermally and electrically effective copper mass being present on both sides of the chip.

22. The semiconductor component of claim 21, wherein a resistance of the electrically effective copper mass is temperature-dependent and exhibits substantial changes in a settable temperature range.

23. The semiconductor component of claim 22, wherein the temperature-dependent resistance is settable at least one of via a selection of a doping profile and via a selection of a geometry of the semiconductor component.

24. The semiconductor component of claim 23, wherein the temperature range, in which the temperature-dependent resistance exhibits substantial changes, is settable at least one of via a selection of the doping profile and via a selection of the geometry of the semiconductor component.

25. The semiconductor component of claim 24, wherein it is used as a temperature-dependent switch.

26. The semiconductor component of claim 24, wherein the switching temperature is settable via selection of the doping profile and/or via selection of the geometry of the semiconductor component, the switching temperature being the temperature at which a substantial change in the temperature-dependent resistance occurs.

27. The semiconductor component of claim 24, wherein the time until a switching temperature is reached is established by setting a predefinable thermal time constant of the semiconductor component.

28. The semiconductor component of claim 24, wherein it is used as temperature-dependent current limiting device.

* * * * *